US008611092B2

(12) United States Patent
Chen

(10) Patent No.: US 8,611,092 B2
(45) Date of Patent: Dec. 17, 2013

(54) CONTAINER DATA CENTER

(75) Inventor: Cheng-Chi Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 61 days.

(21) Appl. No.: 13/473,632

(22) Filed: May 17, 2012

(65) Prior Publication Data
US 2013/0286575 A1 Oct. 31, 2013

(30) Foreign Application Priority Data

Apr. 25, 2012 (TW) .............................. 101114760 A

(51) Int. Cl.
H05K 5/00 (2006.01)
(52) U.S. Cl.
USPC .................. 361/724; 361/679.01; 361/679.02
(58) Field of Classification Search
USPC ........................................................ 361/675
See application file for complete search history.

(56) References Cited

U.S. PATENT DOCUMENTS

| 2010/0302744 A1* | 12/2010 | Englert et al. ................. 361/730 |
| 2011/0242787 A1* | 10/2011 | Jaze et al. ..................... 361/818 |
| 2012/0127656 A1* | 5/2012 | Driggers .................. 361/679.47 |

* cited by examiner

Primary Examiner — Anthony Q Edwards
(74) Attorney, Agent, or Firm — Atlis Law Group, Inc.

(57) ABSTRACT

A container date center includes a floor and a number of cabinets supported on the floor. The floor and each cabinet each define an installation slot. An insulation member defining a receiving slot is received in each installation slot. A wire is received in each receiving slot. An insulating lid is received in each installation slot to shield the receiving slot. A number of connecting portions extend from each wire, through the insulating lid. The installation slot of each cabinet is perpendicular to the installation slot of the floor. One end of the wire of the floor is connected to a power supply. The connecting portions of the floor are connected to bottom ends of the wires of the cabinets, for supplying power to the servers in the cabinets.

8 Claims, 4 Drawing Sheets

CONTAINER DATA CENTER

BACKGROUND

1. Technical Field

The present disclosure relates to a container data center.

2. Description of Related Art

A container data center can include an elevated floor and a number of cabinets supported on the elevated floor. A number of cables are arranged between the cabinets and the power supply. However, in a disorderly fashion, the cables will occupy a large amount of space in the container.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
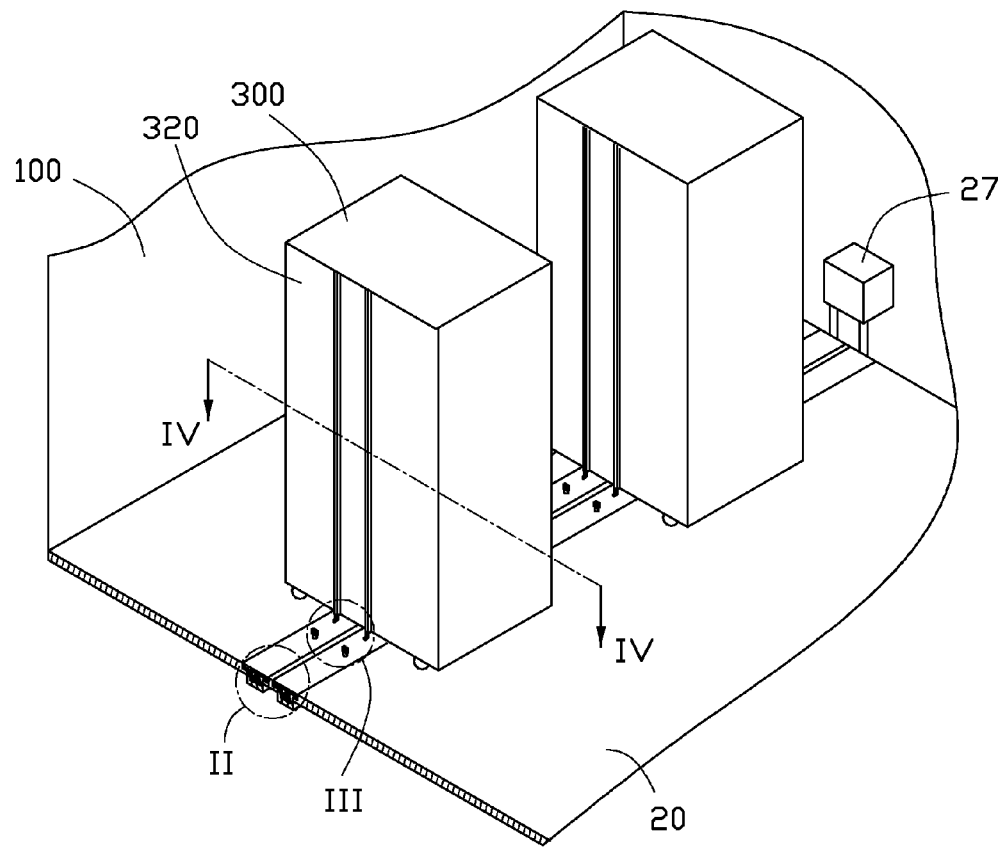
FIG. 1 is isometric view of an exemplary embodiment of a container data center.

FIG. 1 shows an exemplary embodiment of a container data center including a container 100 and a plurality of cabinets 300 received in the container 100. A plurality of servers (not shown) is installed in each cabinet 300.

Figure 2:
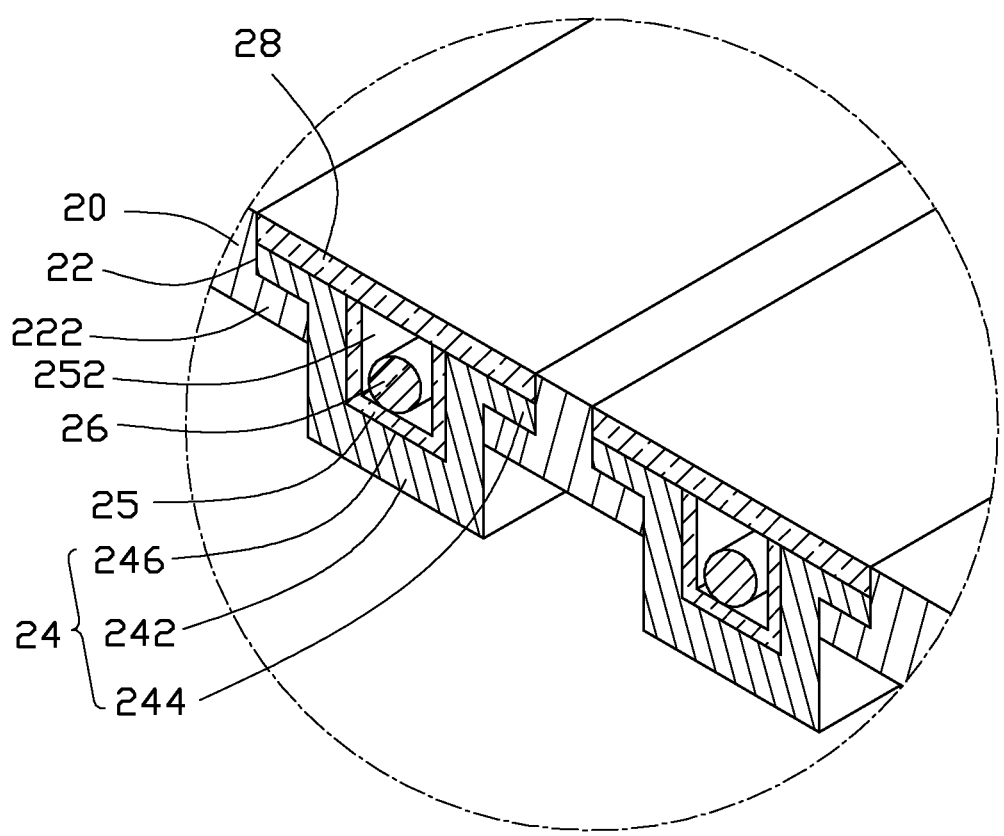
FIG. 2 is an enlarged view of the circled portion II FIG. 1.
Figure 3:
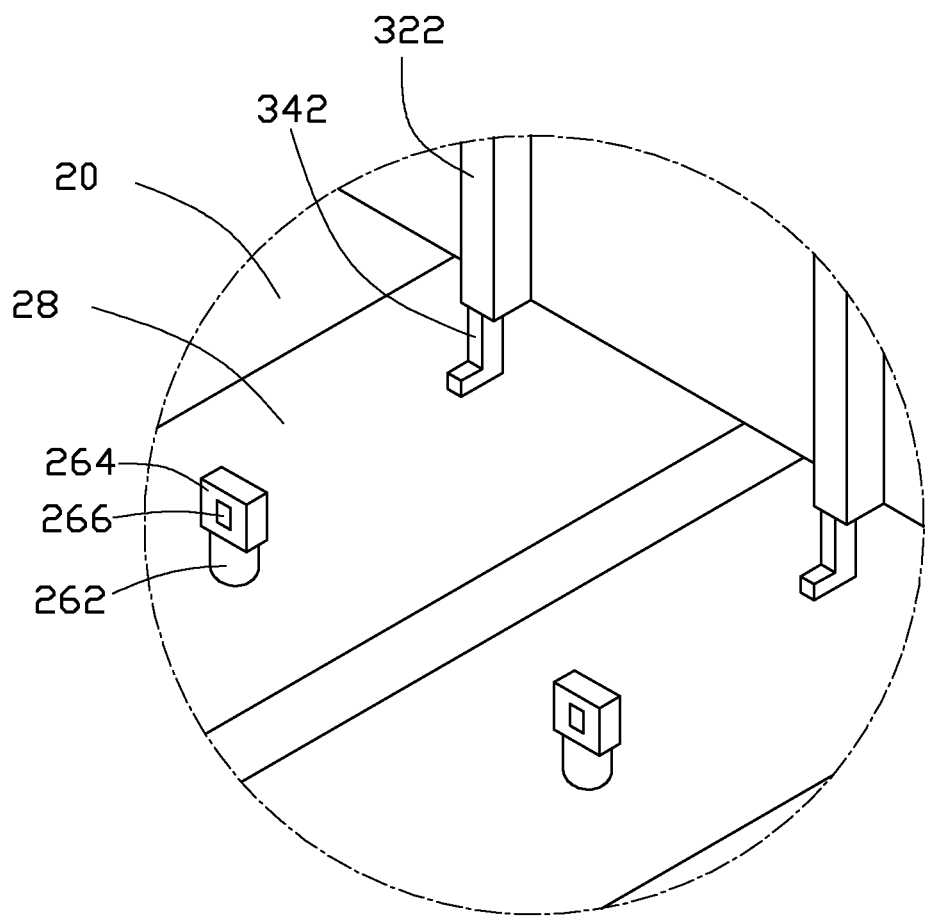
FIG. 3 is an enlarged view of the circled portion III FIG. 1.

Referring to FIGS. 2 and 3, the container 100 includes an elevated floor 20 defining two positioning slots 22. Two spaced tabs 222 extend toward each other from lower portions of opposite side surfaces bounding each positioning slot 22, along the extension direction of the positioning slots 22. A bar-shaped supporting member 24 is installed in each positioning slot 22. Each supporting member 24 includes a U-shaped installation portion 242 sandwiched between the tabs 222, and two fixing bars 244 extending out from opposite sides of an upper portion of the installation portion 242 and supported on the tabs 22. A top surface of each supporting member 24 defines an installation slot 246 extending lengthwise along the installation portion 242. A U-shaped insulation member 25 is received in each installation slot 246. A bottom surface and two opposite side surfaces of the insulation member 25 abut a bottom surface and two opposite inside surfaces of the installation slot 246. A receiving slot 252 is defined in a top surface of the insulation member 25. A wire 26 is received in each receiving slot 252. An insulation lid 28 is supported on the top surface of each supporting member 24, and is received in the positioning slot 22 to shield the receiving slot 252. One end of each wire 26 is connected to a power supply 27. A plurality of connecting portions 262 extends up from each wire 26, through the insulation lid 28. A socket 264 is installed to a distal end of each connecting portion 262, and defines a connecting hole 266. In the embodiment, one of the wires 26 can be regarded as the live line, and the other wire 26 can be regarded as the neutral line.

Figure 4:
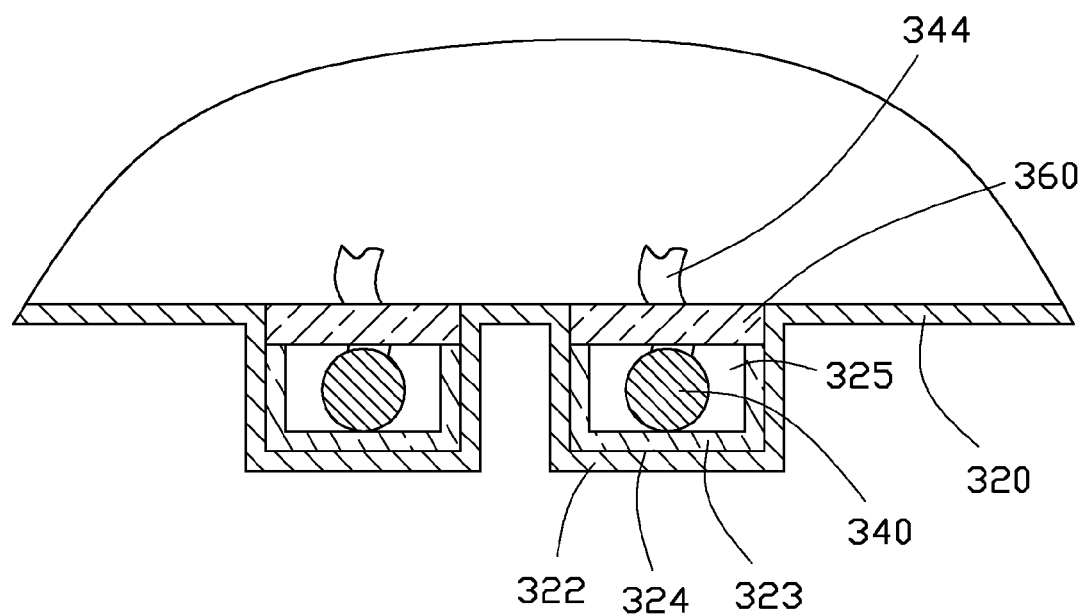
FIG. 4 is a cross-sectional view of FIG. 1, taken along the line of IV-IV.

Referring to FIG. 4, each cabinet 300 includes a sidewall 320. Two bar-shaped protrusions 322 extend out from the sidewall 320, and run lengthwise along the sidewall 320. An installation slot 324 is defined in each protrusion 322, communicating with an inner space of the cabinet 300. An extension direction of each installation slot 324 is perpendicular to an extension direction of each installation slot 246. An insulation member 323 is received in each installation slot 324. The outside surface of the insulation member 323 abuts an inside surface of the installation slot 324. The insulation member 323 defines a receiving slot 325, communicating with the inner space of the cabinet 300. A wire 340 is received in each receiving slot 325. An insulation lid 360 abuts each insulation member 323, and is received in the installation slot 324 to shield the receiving slot 325. A substantially L-shaped connector 342 is installed on a bottom end of each wire 340. A plurality of connecting pins 344 extends from each wire 340, through the insulation lid 360, to connect to the servers in the cabinet 300.

Each cabinet 300 is movable on the elevated floor 20, the connectors 342 are inserted into the connecting holes 266 of the connecting portions 262. The connectors 342 and the connecting portions 262 are wrapped with insulating material.

The insulation lids 28 and 360 can be disengaged from the positioning slots 22 and the installation slots 324, to facilitate changing the wires 26 and 340, and the insulation members 25 and 323.

The wires 340 of each cabinet 300 are connected to the wires 26, for receiving power from the power supply 27 and passing on power to the servers in the cabinet 300, and this arrangement replaces a large number of disorderly cables connecting the power supply 27 to the servers.

Even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center, comprising:
   a floor defining two first installation slots;
   two first insulation members respectively received in the first installation slots, each first insulation member defining a first receiving slot;
   two first wires respectively received in the first receiving slots;
   two first insulation lid to respectively shield the first installation slots;
   a cabinet supported on the floor and defining two second installation slots;
   two second insulation members respectively received in the second installation slots, each second insulation member defining a second receiving slot;
   two second wires respectively received in the second receiving slot; and
   two second insulation lids to respectively shield the second installation slots;
   wherein a plurality of connecting portions extends up from each first wire, extending through the corresponding first insulation lid, an extension direction of each second installation slot is perpendicular to an extension direction of each first installation slot, an end of each first wire is operable to be connected to a power supply, the connecting portions are connected to bottom ends of the corresponding second wires.

2. The container data center of claim 1, wherein the floor defines two positioning slots, a bar-shaped supporting member is installed in each positioning slot, the first installation slot is defined in each supporting member, extending along the lengthwise direction of the supporting member.

3. The container data center of claim 2, wherein two spaced tabs extend toward each other from lower portions of opposite side surfaces bounding each positioning slot, each supporting member comprises a U-shaped installation portion sandwiched between the tabs and two fixing bars extending out from opposite sides of an upper portion of the installation portion and respectively supported on the tabs, the first installation slot is defined in a top surface of each installation portion.

4. The container data center of claim 3, wherein each first insulation member is substantially U-shaped, and is received in the corresponding first installation slot, with an outside surface of the first insulation member abuts an inner surface of the first installation slot, the first receiving slot is defined in a top surface of the first insulation member.

5. The container data center of claim 1, wherein each cabinet comprises a sidewall, two bar-shaped protrusions extend out from the sidewall, and run lengthwise along the sidewall, the second installation slot is defined in each protrusion, communicating with an inner space of the cabinet.

6. The container data center of claim 5, wherein each second insulation member is substantially U-shaped, and is received in the corresponding second installation slot, with an outside surface of the second insulation member abuts an inside surface of the second installation slot, the second receiving slot is defined in the second insulation member, communicating with the inner space of the cabinet.

7. The container data center of claim 1, wherein a socket defining a connecting hole is installed to a distal end of each connecting portion, a connector is installed to a bottom end of each second wire and inserted into the corresponding connecting hole.

8. The container data center of claim 1, wherein a plurality of connecting pins extends from each second wire, through the corresponding second insulation lid.

* * * * *